US009121900B2

(12) United States Patent  (10) Patent No.: US 9,121,900 B2
Bassin  (45) Date of Patent: Sep. 1, 2015

(54) SYSTEMS AND METHODS FOR SENSING SIGNALS COMMUNICATED WITH A HOST DEVICE OR ON AN INTERFACE OF PLUG-IN CARD WHEN THERE IS LACK OF ACCESS TO SENSING POINTS

(71) Applicant: Evgeni Bassin, Beer Sheva (IL)

(72) Inventor: Evgeni Bassin, Beer Sheva (IL)

(73) Assignee: SanDisk Technologies Inc., Plano, TX (US)

( * ) Notice: Subject to any disclaimer, the term of this patent is extended or adjusted under 35 U.S.C. 154(b) by 197 days.

(21) Appl. No.: 13/648,209

(22) Filed: Oct. 9, 2012

(65) Prior Publication Data

US 2013/0141134 A1   Jun. 6, 2013

Related U.S. Application Data

(60) Provisional application No. 61/566,571, filed on Dec. 2, 2011.

(51) Int. Cl.
*G01R 31/26* (2014.01)
*G01R 31/28* (2006.01)

(52) U.S. Cl.
CPC .................................. *G01R 31/2889* (2013.01)

(58) Field of Classification Search
CPC ............................ G01R 31/2889; G01R 23/02
USPC ............. 324/762.01, 762.02, 762.03, 762.04, 324/763.01, 763.02; 343/703, 841
See application file for complete search history.

(56) References Cited

U.S. PATENT DOCUMENTS

| 6,605,871 | B2 | 8/2003 | Chaki |
| 6,791,317 | B1 * | 9/2004 | Walsh et al. ............. 324/756.02 |
| 7,127,550 | B1 | 10/2006 | Lin |
| 7,417,446 | B2 | 8/2008 | Hayden et al. |
| 7,436,724 | B2 | 10/2008 | Nandi |
| 7,495,456 | B2 | 2/2009 | Horii et al. |
| 7,539,900 | B1 | 5/2009 | Plofsky |
| 7,788,553 | B2 | 8/2010 | Chow et al. |
| 7,962,794 | B2 | 6/2011 | Bennet et al. |
| 8,305,276 | B2 * | 11/2012 | Yang et al. ..................... 343/703 |
| 2004/0123192 | A1 | 6/2004 | Caty et al. |
| 2006/0049995 | A1 * | 3/2006 | Imaoka et al. ................ 343/702 |
| 2008/0143611 | A1 * | 6/2008 | Wang ............................ 343/702 |
| 2008/0162071 | A1 | 7/2008 | Stevens et al. |

(Continued)

OTHER PUBLICATIONS

PCT International Search Report and Written Opinion of the International Searching Authority (ISA) issued in International Application No. PCT/US2012/067620, United States Patent and Trademark Office, Feb. 15, 2013.

*Primary Examiner* — Arleen M Vazquez
*Assistant Examiner* — Lee Rodak
(74) *Attorney, Agent, or Firm* — Martine Penilla Group, LLP

(57) ABSTRACT

A circuit system for testing a chip is provided. The circuit system includes a first layer coupled with a plurality of ground communication mediums. Each ground communication medium facilitates communication of a ground signal. The circuit system includes a second layer coupled with a first integrated circuit chip. The second layer is coupled with a plurality of radio frequency (RF) communication mediums. The RF communication mediums facilitate communication of RF signals. The first integrated circuit chip communicates via one of the RF signals and the ground signal with a second integrated circuit chip. The first and second layers are used to probe the RF signals and the ground signal.

20 Claims, 9 Drawing Sheets

(56) References Cited

U.S. PATENT DOCUMENTS

2010/0277197 A1 * 11/2010 Deutsch et al. ............... 324/758
2011/0140974 A1 6/2011 Yang et al.
2011/0149740 A1 6/2011 Cases et al.

* cited by examiner

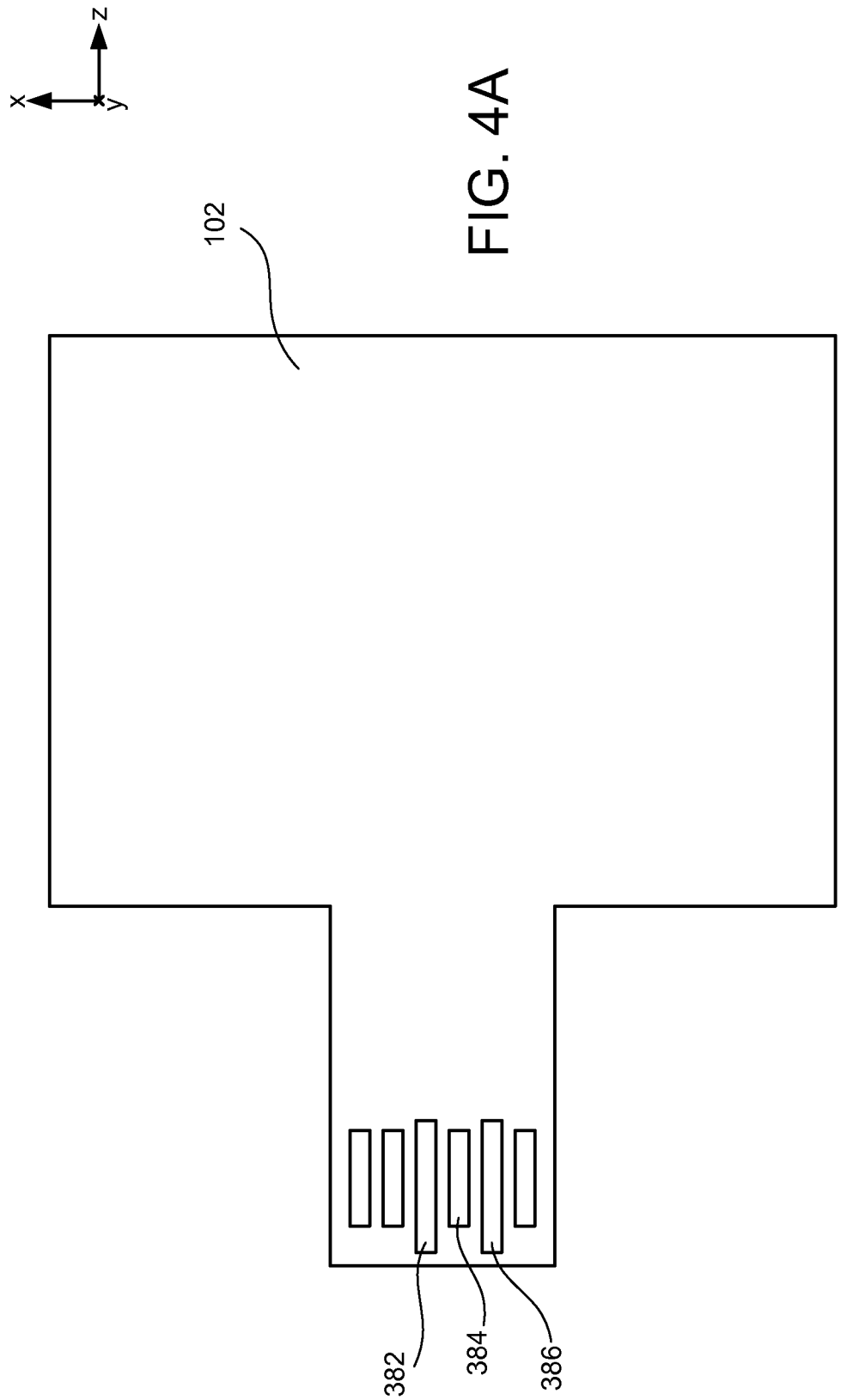

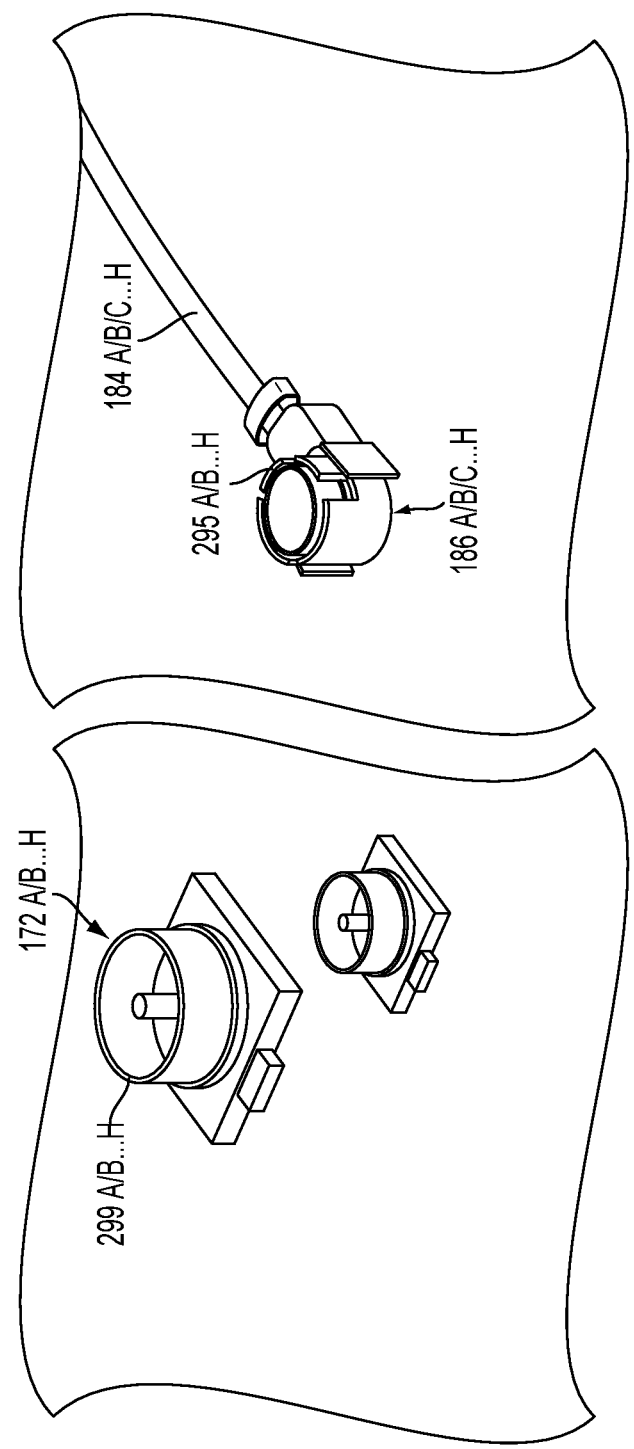

SYSTEMS AND METHODS FOR SENSING SIGNALS COMMUNICATED WITH A HOST DEVICE OR ON AN INTERFACE OF PLUG-IN CARD WHEN THERE IS LACK OF ACCESS TO SENSING POINTS

CLAIM OF PRIORITY

This application claims the benefit of and priority to, under 35 U.S.C. 119§(e), to U.S. Provisional Patent Application No. 61/566,571, filed on Dec. 2, 2011, and titled "SYSTEMS AND METHODS FOR SENSING SIGNALS COMMUNICATED WITH A HOST DEVICE OR ON AN INTERFACE OF A PLUG-IN CARD WHEN THERE IS LACK OF ACCESS TO SENSING POINTS", which is hereby incorporated by reference in its entirety.

FIELD

The present invention relates to systems and methods for sensing signals communicated with a host device or on an interface of a plug-in card when there is lack of access to sensing points.

BACKGROUND

A variety of electronic devices, such as cellular phones, digital cameras, and tablets, are used for personal and business purposes. While some people enjoy the use of an electronic device, other people use the electronic device for work-related purpose. Integrated circuits are used in the electronic devices. Such integrated circuits process information received from and stored within memory chips. The memory chips are used to store a variety of information, such as images, videos, animations, and text.

A controller acts as an interface between the integrated circuit and the memory chip. For example, the controller transfers signals received from the integrated circuit into a form that the memory chip is designed to interpret and transfers signals received from the memory chip into a form that the integrated circuit is designed to interpret. It is important that the controller acts as intended and so does the integrated circuit and the memory chip.

It is within this context that various embodiments of the present invention arise.

SUMMARY

Embodiments of the present invention provide systems and methods for sensing signals communicated with a host device or on an interface of a plug-in card when there is lack of access to sensing points.

In one embodiment, a sensing circuit is integrated with a plug-in card in such way to allow measurement as if there is access to inside of the host device. To obtain the measurement, extra layers for sensing signals are added to the plug-in card and an extension is also added to the plug-in card. The extension is added for placement of one or more RF connectors. With the use of the extra layers and the extension, signals inside the host device can be observed without a need to open the host device and without a need to perform complicated measurements.

In one embodiment, a circuit system for testing a chip is provided. The circuit system includes a first layer coupled with a plurality of ground communication mediums. Each ground communication medium facilitates communication of a ground signal. The circuit system includes a second layer coupled with a first integrated circuit chip. The second layer is coupled with a plurality of radio frequency (RF) communication mediums. The RF communication mediums facilitate communication of RF signals. The first integrated circuit chip communicates via one of the RF signals and the ground signal with a second integrated circuit chip. The first and second layers are used to probe the RF signals and the ground signal.

In another embodiment, a circuit system for testing a chip is provided. The circuit system includes a first layer and a second layer coupled with a plurality of ground communication mediums. The second layer is placed with respect to the first layer. Moreover, each ground communication medium facilitates communication of a ground signal. The circuit system also includes a third layer coupled with a chip. The third layer is coupled with a plurality of radio frequency (RF) communication mediums. The RF communication mediums facilitate communication of RF signals. The second and third layers are used to probe the RF signals and the ground signal.

In yet another embodiment, a circuit system for testing a chip is provided. The circuit system includes a first layer, a second layer on top of the first layer and a third layer coupled with a plurality of ground communication mediums. Each ground communication medium is used for communicating a ground signal. The circuit system includes a fourth layer coupled with a chip and the fourth layer is coupled with a plurality of RF communication mediums. The RF communication mediums facilitate communication of RF signals. The third layer is on top of the second layer and the fourth layer is on top of the third layer. Also, the third and fourth layers are used to probe the RF signals and the ground signal.

In several embodiments, the systems and methods provide two or more additional layers to a layer structure. In one embodiment, the layer structure includes one or two layers and the additional layers accommodate a package. The package includes a controller and a controlled chip, such as a memory chip. The two additional layers provide space for coupling one or more radio frequency (RF) connectors that are coupled via mating RF connectors with an oscilloscope. The RF connectors are coupled with the controller via communication mediums, a portion of which is embedded within the top additional layer. Also, the bottom additional layer provides one or more ground communication mediums that transfer a ground signal.

The firm coupling between the controller and the RF connectors facilitates use of a circuit subsystem that includes the layer structure and the two additional layers with a host device, such as a digital camera, a tablet, or a cellular phone while the host device is in operation. The circuit subsystem can be probed with the oscilloscope at a time a portion of the circuit subsystem is inserted into a slot of the device. Communication signals between the controller, the controlled chip, and chips inside the host device can be probed with the circuit subsystem when the host device is in operation and waveforms representing the communication signals can be made visible with the oscilloscope.

Other aspects of the present invention will become apparent from the following detailed description, taken in conjunction with the accompanying drawings, illustrating by way of example the principles of various embodiments of the present invention.

BRIEF DESCRIPTION OF THE DRAWINGS

Various embodiments of the present invention may best be understood by reference to the following description taken in conjunction with the accompanying drawings in which:

FIG. 4A is a bottom view of an embodiment of a first layer of the circuit subsystem, in accordance with one embodiment of the present invention.

FIG. 5 is an isometric view of an embodiment of radio frequency (RF) connectors, RF mating connectors, and RF cables, in accordance with one embodiment of the present invention.

DETAILED DESCRIPTION

It should be noted that various embodiments of the present invention may be practiced without some or all of these specific details. In other instances, well known process operations have not been described in detail in order not to unnecessarily obscure various embodiments of the present invention.

Figure 1:
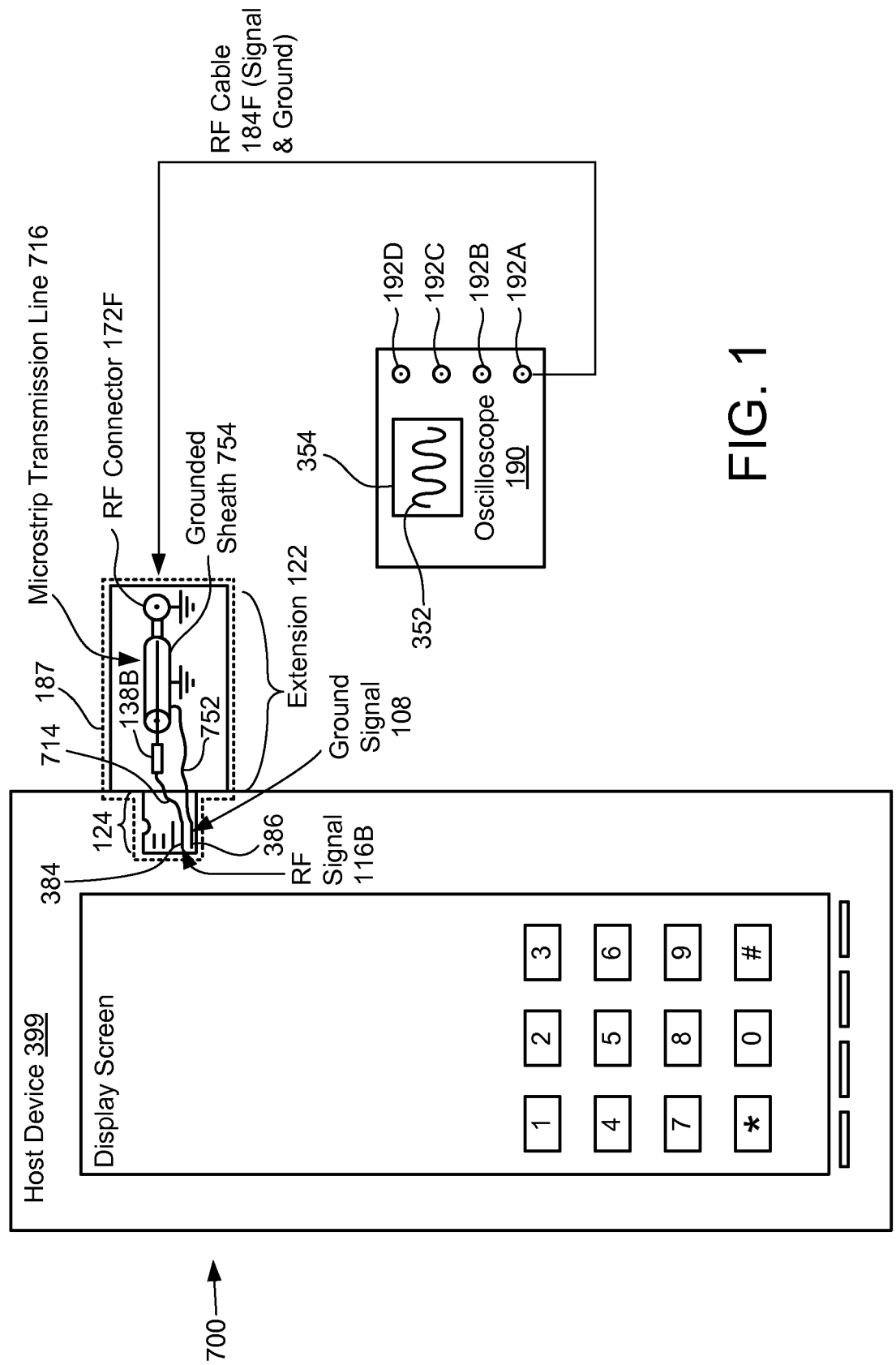
FIG. 1 is a block diagram of an embodiment of a system for testing signals communicated between an integrated circuit within a host device and a chip package and communicated between chips within the chip package, in accordance with one embodiment of the present invention.

FIG. 1 is a block diagram of an embodiment of a system 700 for testing signals receiving from an integrated circuit within a host device 399 via a circuit subsystem 187. Examples of a host device include a digital camera, a tablet, and a smart phone. A portion 124 of the circuit subsystem 399 is inserted into a slot of the host device 399. There is no need to open the host device 399 to test the host device 399. An extension 122 of the circuit subsystem 187 extends outside the host device 399. The host device 399 is operational for its intended purpose when the portion 124 is inserted into the slot. For example, the host device 399 is operational to play a game, to send an email, to browse the web, or to make a phone call, when the portion 124 is inserted into the slot of the host device 399.

When the host device 399 is operational, an RF signal communicated between a chip 792 (shown in FIG. 2) within the host device 399 and a memory controller chip 112 (shown in FIG. 2) is tested. For example, an RF signal 116B is received by a channel connector 192A of an oscilloscope 190 from the chip 792 of host device 399. In this example, the RF signal 116B is received via a communication medium 384, a combination 714 of a via and a communication medium coupled with the communication medium 384, a resistor 138B coupled with the connection medium 714, a microstrip transmission line 716 coupled with the resistor 138B, an RF connector 172F coupled with the microstrip transmission line 716, and an RF mating connector 186F (shown in FIG. 5) of an RF cable 184F that is coupled with the RF connector 172F.

In this example, the ground signal 108 is received by the channel connector 192A from the chip 792 within the host device 399 via a communication medium 386, a combination 752 of a via and a communication medium, a ground communication medium of the microstrip transmission line 716, RF connector 172F, and the RF cable 184F.

In some embodiments, an RF signal is a data signal, a control signal, or a power signal. Examples of a control signal include a command signal, an enable signal, a clock signal, and an address signal. A data signal is used to transfer data. A power signal is used to transfer power. A ground signal is used to provide a reference voltage to another signal, such as a power signal, data signal, or a control signal. In one embodiment, the ground signal has zero voltage or another low voltage, such as a negative voltage.

The oscilloscope 190 displays, on a display screen 354, a waveform 352 representing a differential signal that represents a difference between a voltage of the RF signal 116B and the ground signal 108. The waveform 352 is studied by a user to determine whether the chip within the host device 399 is functioning as intended. Similarly, other signals communicated with the circuit subsystem 187 are represented on the oscilloscope 190 as described below with reference to FIG. 2.

Figure 2:
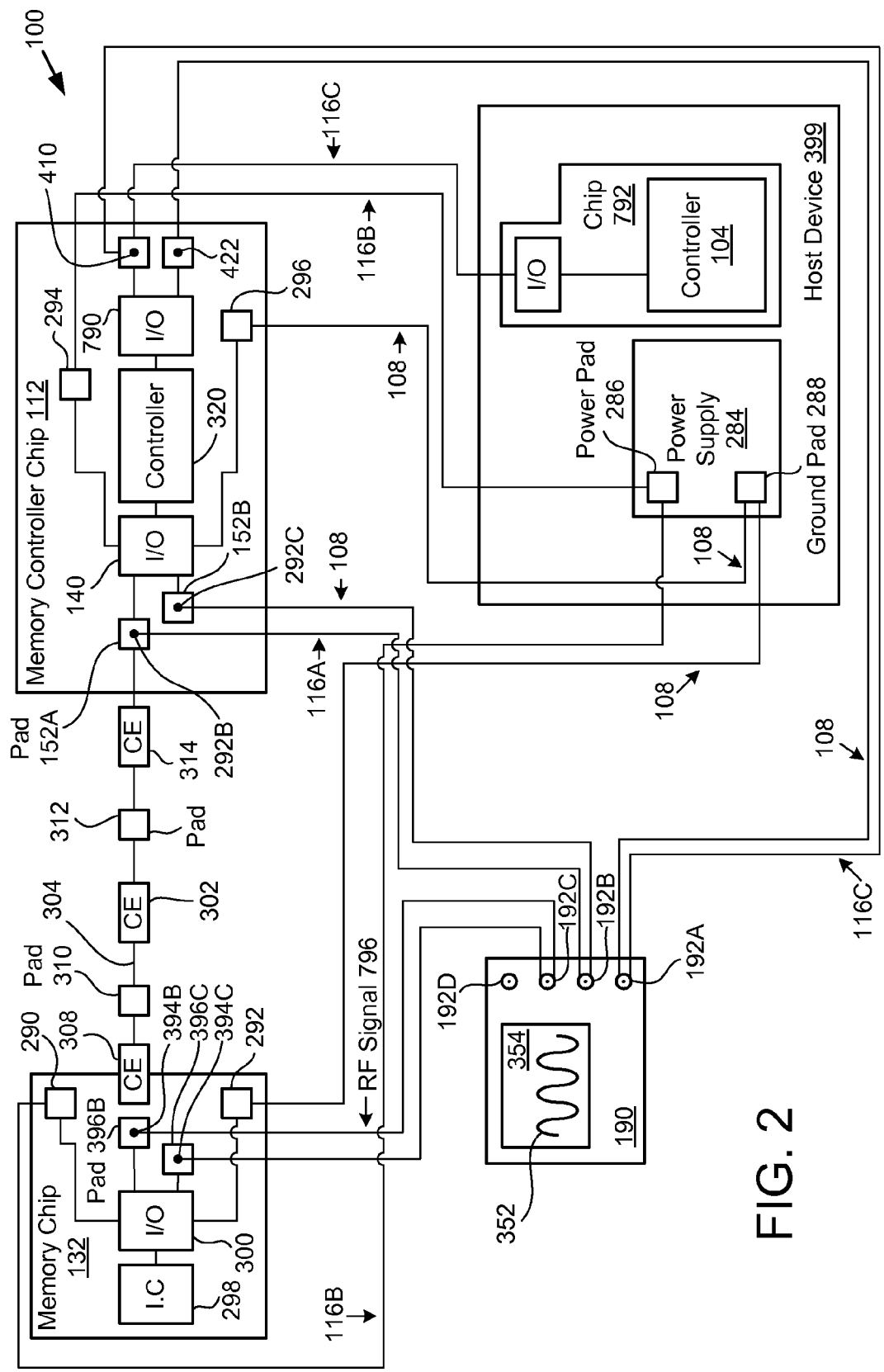
FIG. 2 is a block diagram of a test system for testing one or more chips, in accordance with one embodiment of the present invention.

FIG. 2 is a block diagram of an embodiment of a test system 100 for testing RF signals communicated between a memory chip 132 and a memory controller chip 112 and between the memory chip controller 112 and the controller 104. In some embodiments, the memory controller chip 112 and the memory chip 132 are packaged as a secure digital (SD) card or a microSD package. The SD card or the microSD package is a part of the circuit subsystem 187 (FIG. 1). As an example, memory controller chip 112 includes a memory controller 320 that is used to transfer command signals received from a processor of the controller 104 into read and write signals. The read signal is sent to the memory chip 132, to read data stored in an integrated circuit 298, which is a memory array, and the write signal is sent to the integrated circuit 298 to write data to the memory array. Examples of a memory array includes a non-volatile memory, a volatile memory, a Flash memory, a NAND type memory, a NOR type memory, a random access memory, a read-only memory, and an electrically erasable programmable read-only memory (EEPROM).

In one embodiment, the memory controller 320 also sends other signals, such as a clock signal, a read enable signal, a memory address signal, and a write enable signal, to the memory array upon receiving the command signals. The read enable signal is sent before sending a read signal to enable the reading of data from the memory array and the write enable signal is sent before sending a write signal to enable the writing of data to the memory array. Memory address signals include an address, such as a row address and a column address, of a memory location of the memory array from which data is read or to which data is written.

The host device 399 includes a power supply 284 that supplies power via a power pad 286 and a ground pad 288 to the chips 132 and 112. For example, to provide power to integrated circuit 298, the power supply 284 supplies a radio frequency (RF) signal 116B via a power pad 290 of memory chip 132 and an I/O 300. Moreover, in this example, to provide power to integrated circuit 298, the power supply 284 supplies a ground signal 108 via a ground pad 292 of the chip 132 and the I/O 300. Each circuit component, such as an integrated circuit 298 or an input/output (I/O) circuit 300 of chip 132 receives the RF signal 116B via the power pad 290 and the ground signal 108 via the ground pad 292. As another example, to provide power to memory controller chip 112, the power supply 284 supplies the RF signal 116B to the memory controller 320 via a power pad 294 and an I/O 140 and supplies the ground signal 108 to the controller 320 via a ground pad 296 of the memory controller chip 112 and the I/O 140. Each circuit component, such as controller 320 or I/O circuit 140, of memory controller chip 112 receives the RF signal 116B via the power pad 294 and the ground signal 108 via the ground pad 296.

In some embodiments, the memory chip 132 has its own power supply that is located within a chip package that includes the memory chip 132. In other embodiments, the memory controller chip 112 has its own power supply that is located within a chip package that includes the memory controller chip 112. In one embodiment, a chip package that includes the memory controller chip 112 and the memory chip 132 has its own power supply that is located within the chip package.

An I/O circuit allows interfacing between a chip and circuit components located outside the chip. For example, the I/O circuit 300 facilitates a communication between the integrated circuit 298 and memory chip 132 via a communication line 304. In some embodiments, an I/O circuit includes a tristate buffer.

In one embodiment, the I/O circuit 300 is coupled with circuit elements 302 via a pad 396B, circuit elements 308 and pad 310. The pad 396B is attached to memory chip 132. A Circuit elements, as used herein, refer to one or more resistors, one or more inductors, and/or one or more capacitors. In some embodiments, circuit elements are coupled in series with each other, in parallel with each other, or in a combination thereof.

Similarly, the I/O circuit 140 is coupled with circuit elements 302 via a pad 312, a pad 152A and circuit elements 314. The I/O circuit 140 is coupled to memory controller 320. A point 394B on a pad 396B that is on memory chip 132 facilitates communication of an RF signal between memory chip 132 and another chip, such as memory controller chip 112.

The oscilloscope 190 is coupled with a point 292B on pad 152A and a point 292C on pad 152B. Similarly, the oscilloscope 190 is coupled with the point 394B and another point 394C on pad 396C. Also, the oscilloscope 190 is coupled with a connection point 410 and a connection point 422 of memory controller chip 112. The connection of the oscilloscope 190 with the points 292B and 292C facilitate Kelvin probing of an RF signal 116A and the ground signal 108. In one embodiment, the RF signal 116A is communicated with another chip, such as the memory chip 132. Similarly, the connection of the oscilloscope 190 with the points 394B and 394C facilitate Kelvin probing of an RF signal 796 and the ground signal 108. The RF signal 796 is communicated between the memory chip 132 and another chip, such as the memory controller chip 112. Moreover, the connection of the oscilloscope 190 with the connection points 410 and 422 facilitate Kelvin probing of an RF signal 116C and the ground signal 108.

Such Kelvin probing avoids signal corruption due to circuit elements 308, 302, and/or 314. For example, if a signal on communication line 304 is probed with oscilloscope 190, signals output from the I/O 300 may be corrupted by the circuit elements 308. Hence, in such a case, the oscilloscope 190 displays waveforms that represent corrupted signals, which is undesirable. It should be noted that in some embodiments, probing, sensing, and measuring are used interchangeably herein.

The oscilloscope 190 receives multiple channel connectors 192 that are coupled with different pads to probe different signals. For example, the channel connector 192C is coupled with pads 396B and 396C to probe RF signal 796 and ground signal 108 communicated to or from I/O 300 and the channel connector 192B is coupled with points 292B and 292C to probe RF signal 116A and ground signal 108 communicated to or from I/O 140. As another example, the channel connector 192A is coupled with a connection point 410 to probe RF signal 116C communicated to or from an I/O 790 and the channel connector 192A is coupled with point 410 to probe ground signal 108 communicated to or from I/O 790. The waveform 352 representing a probed signal, such as RF signal 116C, 116B, or RF signal 116A, is presented on a display screen 354 of the oscilloscope 190.

It should be noted that in some embodiments, an RF signal is probed with reference to ground signal 108. For example, an RF connector, described below, coupled via an RF cable, also described below, to oscilloscope 190 receives an RF signal and the ground signal 108 simultaneously to probe the RF signal.

Figure 3A:
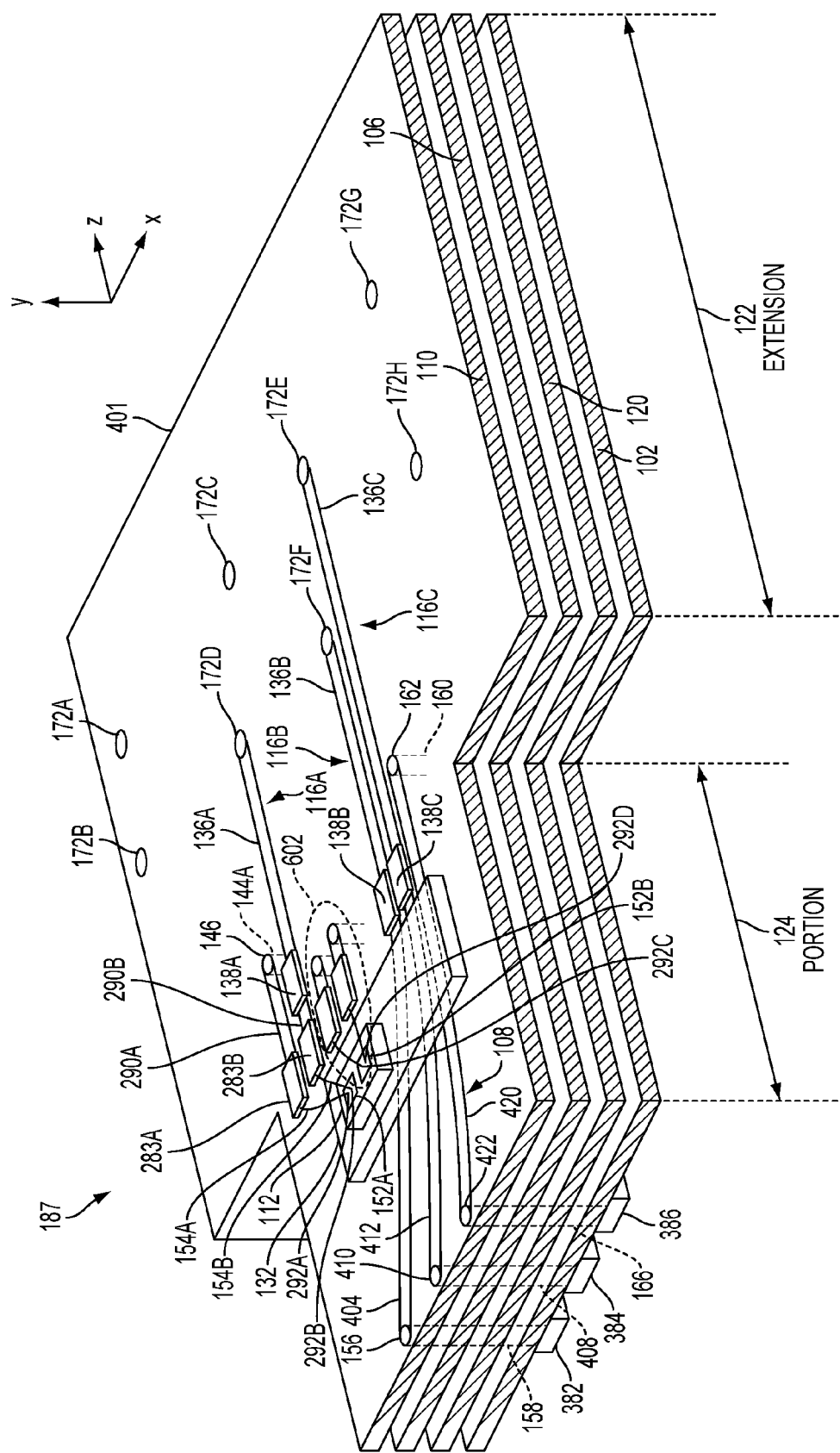
FIG. 3A is an isometric view of a circuit subsystem for testing the one or more chips, in accordance with one embodiment of the present invention.

FIG. 3A is an isometric view of an embodiment of the circuit subsystem 187 for testing RF signal 796, RF signal 116A, RF signal 116B, and RF signal 116C. A layer 102 of the circuit subsystem 187 is a hard layer of a flexible layer, which is further described below.

A plurality of communication mediums 382, 384, and 386 are overlaid underneath the layer 102. Each communication medium 382, 384, and 386 facilitates communication of an RF signal with the processor of the controller 104 (FIG. 1). A communication medium of a layer includes an electrical conductor, which is made of a conductive metal, such as copper, silver, or gold. In some embodiments, a communication medium is a wire, a metal finger, or a metal conductor trace. At least a portion of the metal conductor trace of a layer is embedded within the layer. In various embodiments, a communication medium a ball array or a pad array. In one embodiment, a communication medium is overlaid on top of a layer with a deposition process, such as chemical vapor deposition or atomic layer deposition. In some embodiments, a portion of a layer is etched away to deposit a communication medium within the etched portion.

In various embodiments, a communication medium is a part of a microstrip transmitting line that facilitates communication of an RF signal. The microstrip transmitting line also includes a ground communication medium that transfers ground signal 108. A transmitting line has a constant impedance, such as ranging from 45 ohms to 55 ohms, for high frequency signals. For example, a transmitting line has an impedance of 50 ohms.

Communication medium 382 conducts RF signal 116B, communication medium 384 conducts RF signal 116C, and communication medium 386 conducts ground signal 108. In various embodiments, any number of communication mediums is overlaid underneath layer 102.

A layer 120 is placed on the layer 102 to be located between the layer 102 and a layer 106. As an example, the layer 120 is a hard layer. As another example, the layer 120 is flexible. As an example, the layer 106 is a hard layer or flexible. In one embodiment, various circuit components, such as, one or more memories, one or more memory controllers, one or more processors, one or more I/Os, and/or one or more RF oscillators, are located on the layer 120, and are electrically connected with each other via one or more communication mediums of layer 120. In some embodiments, the layer 120 excludes circuit components.

The layer 106 is coupled with the ground signal 108. In one embodiment, the layer 106 includes multiple ground connection mediums 142 (shown below in FIG. 4C) that transfer ground signal 108 and the layer 106 does not transfer any other signal except for the ground signal 108. In various embodiments, each ground communication medium 142A, 142B, 142C, 142D, 142E, 142F, 142G, and 142H is a layer of metal that conducts the ground signal 108. Each of ground communication mediums 142 is overlaid on top of layer 106 so that at least a portion of each of ground communication mediums 142 is embedded within layer 106. In some embodiments, each of ground communication mediums 142 is overlaid with a deposition process.

A layer 110 is placed on top of the layer 106 and is coupled with the memory controller chip 112. The layer 110 is a hard layer or flexible. Examples of a hard layer include a substrate or a substrate of a printed circuit board (PCB). Examples of a flexible layer include a flexible cable. The memory chip 132 is located on top of layer 110 and is attached to layer 110. In some embodiments, a chip is attached to a layer through a ball grid array or another conductor array. In other embodiments, a chip is attached to a layer via pads that are embedded within the layer.

Memory controller chip 112 is located on top of memory chip 132 and is attached to memory chip 132. In some embodiments, instead of being located on top of memory chip 132, the memory controller chip 112 is located besides memory chip 132 and on top of layer 110. In these embodiments, the memory controller chip 112 is attached to layer 110. In one embodiment, a chip controlled with a controller is used instead of memory chip 132.

A point 292A on a pad 152A facilitates communication of RF signal 116A between memory controller chip 112 and another chip. The pad 152A is attached to memory controller chip 112. In some embodiments, attachment of a pad to a surface of a chip or a layer is done by a deposition process that deposits a material of the pad to the surface. A wire 154A is coupled with point 292A. The wire 154A is further coupled with a pad 283A, which is attached to layer 110. The pad 283A is coupled through a communication medium 290A, a connection point 146, and a via 144A to the layer 120. In some embodiments, a connection point is a pad.

The via 144A extends through layers 110 and 106 to communicate RF signal 116A with a connection point on layer 120. In some embodiments, the via 144A is coupled with one or more communication mediums within layer 120 and the one or more communication mediums are coupled with one or more circuit components that are located on layer 120 to communicate the RF signal 116A.

In one embodiment, the via 144A is coupled with one or more communication mediums within layer 120 and the one or more communication mediums are coupled through one or more vias with the communication mediums 382, 384, and 386.

In various embodiments, via 144A is coupled with a communication medium that was connected to memory controller chip 112 when memory controller chip 112 was located on layer 120. The via 144A is coupled with the communication medium to conduct the RF signal 116A. When memory controller chip 112 was located on layer 120, the memory controller chip 112 was located between layers 120 and 106.

Moreover, a point 292B on the pad 152A facilitates communication of an RF signal between memory controller chip 112 and the oscilloscope 190 (FIG. 1). A wire 154B is coupled with point 292B. The wire 154B is further coupled with a pad 283B, which is attached to layer 110. The pad 283B is coupled via a communication medium 290B with a resistor 138A, which is further coupled via a communication medium 136A with an RF connector 172D, at least a portion of which is embedded with the layer 110. In one embodiment, at least a portion of an RF connector is embedded within a layer by etching a portion of the layer and placing the RF connector within the portion. Similarly, at least a portion of each of RF connectors 172A, 172B, 172C, 172E, 172F, 172G, and 172H is embedded within the layer 110.

Figure 4B:
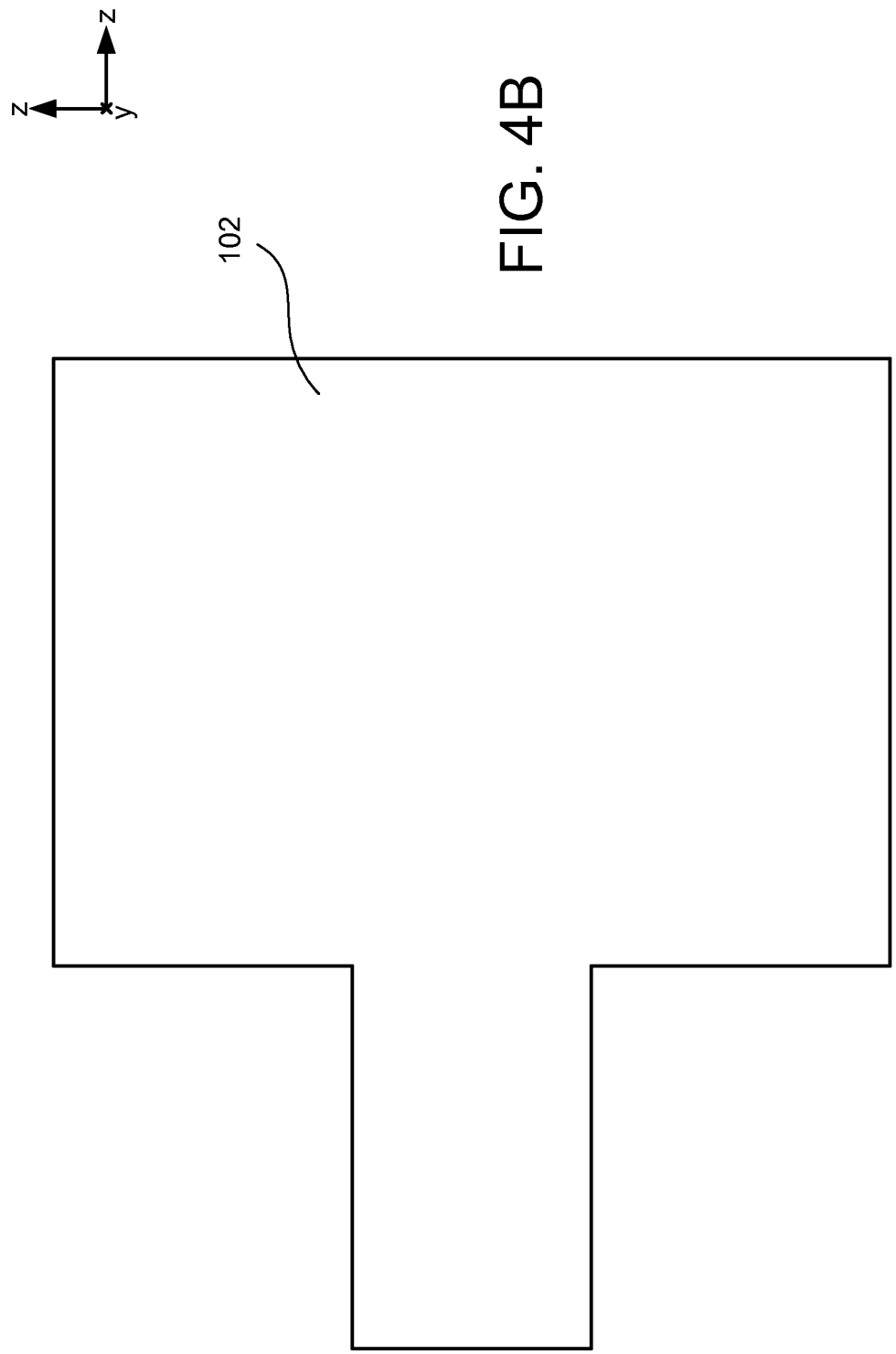
FIG. 4B is a top view of an embodiment of a second layer of the circuit subsystem, in accordance with one embodiment of the present invention.
Figure 4C:
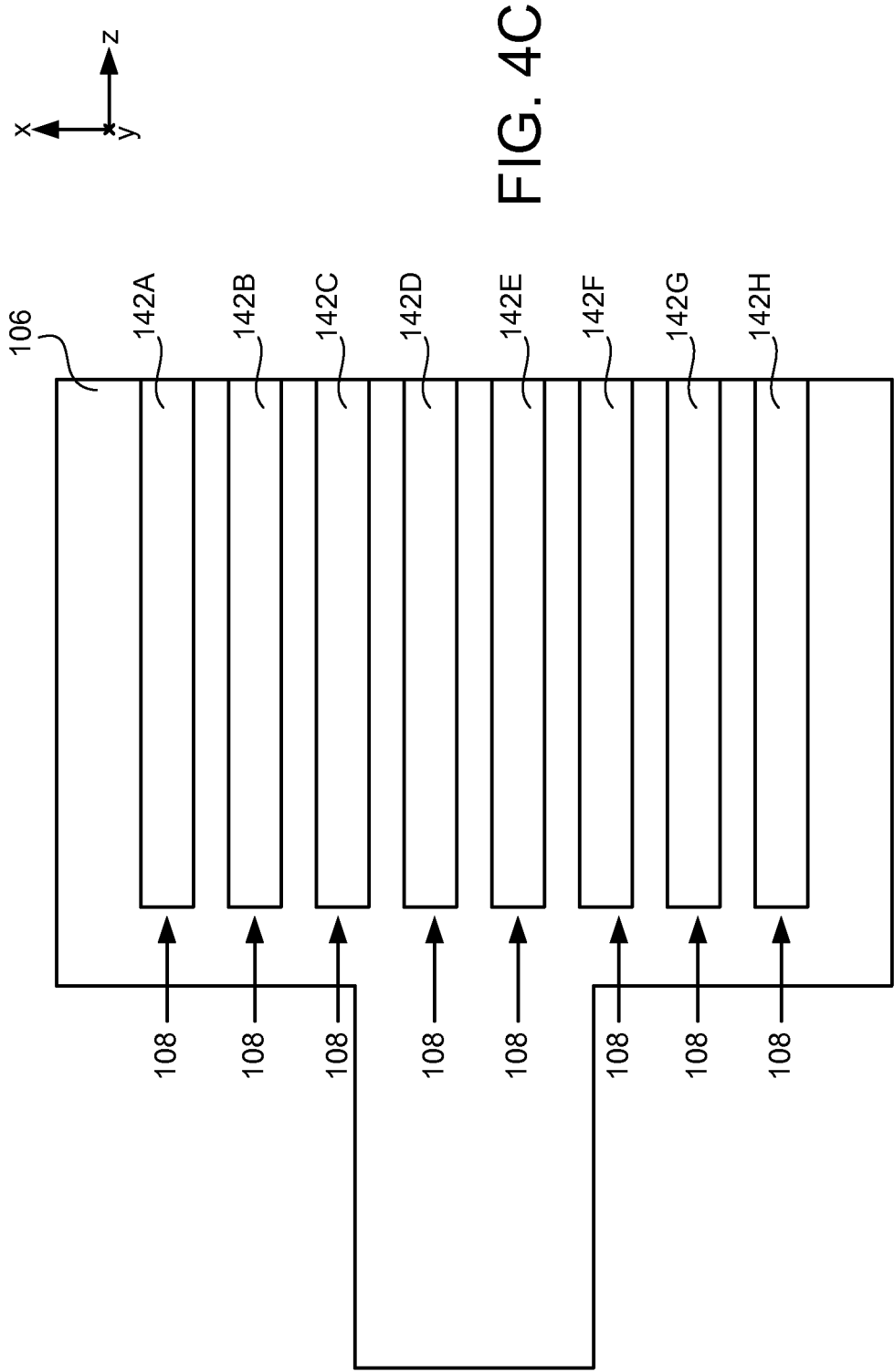
FIG. 4C is a top view of an embodiment of a third layer of the circuit subsystem, in accordance with one embodiment of the present invention.
Figure 4D:
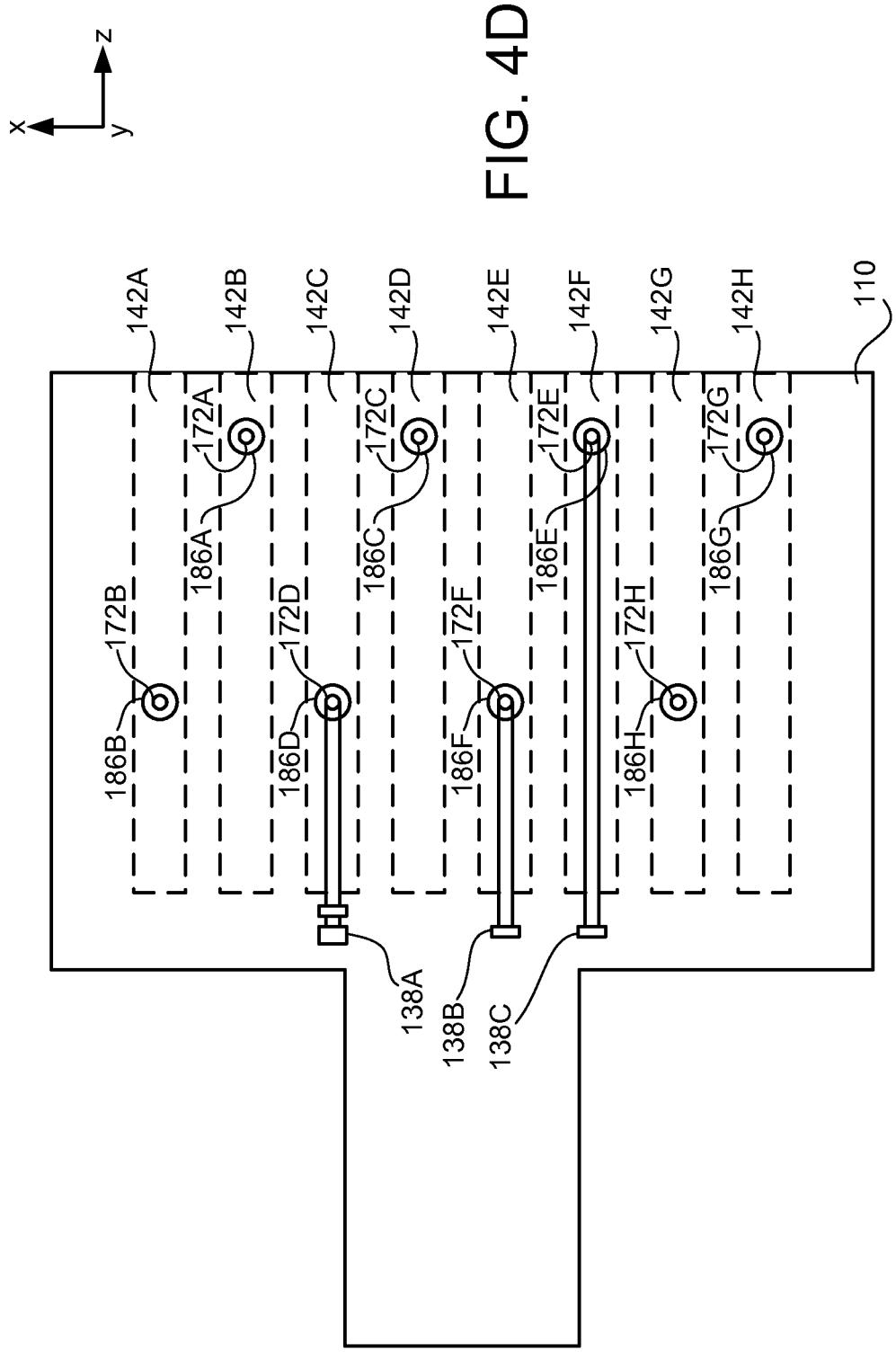
FIG. 4D is a top view of an embodiment of a fourth layer of the circuit subsystem, in accordance with one embodiment of the present invention.

A mating RF connector 186D, which is shown in FIG. 4D, is coupled with the RF connector 172D. An edge 299D of RF connector 172D, which is shown in FIG. 5, is coupled with the ground communication medium 142C. Moreover, an edge 295D of the mating RF connector 186D is coupled with the edge 299D to communicate ground signal 108 to the channel connector 192B (FIG. 1).

Similarly, each of RF mating connectors 186A, 186B, 186C, 186E, 186F, 186G, and 186H is coupled with a corresponding one of RF connectors 172A, 172B, 172C, 172E, 172F, 172G, and 172H. It should be noted that any number of RF connectors 172 and any number of RF mating connectors 172 may be used.

The mating RF connector 186D is coupled via a cable 184D, shown below in FIG. 5, with the channel connector 192B (FIG. 1). Similarly, each of remaining mating RF connectors 186A, 186B, 186C, 186E, 186F, 186G, and 186H are coupled via respective cables 184A, 184B, 184C, 184E, 184F, 184G, and 184H to respective channel connectors of oscilloscope 190.

In some embodiments, instead of embedding a portion of each of RF connectors 172, the RF connectors 172 are coupled with an edge 401 of the extension and are coupled with corresponding communications mediums 136 and edges of the RF connectors 172 are coupled with the corresponding ground communication mediums 142.

The extension 122 of circuit subsystem 187 includes a portion of the layer 102, a portion of the layer 120, a portion of the layer 106, and a portion of the layer 110. The remaining portion 124 of circuit subsystem 187 includes the remaining portion of the layer 102, the remaining portion of the layer 120, the remaining portion of the layer 106, and the remaining portion of the layer 110.

In one embodiment, the portion 124 of the layers 106 and 110, the memory chip 132, and the memory controller chip 112 are packaged as a memory chip card, such as, an SD card or a microSD card. In this embodiment, the extension 122 and the portion 124 of layers 106 and 110 are added to the portion 124 of the layers 106 and 110. For example, the extension 122 of layers 102 and 120 is soldered to the portion 124 of the layers 102 and 120.

Figure 3B:
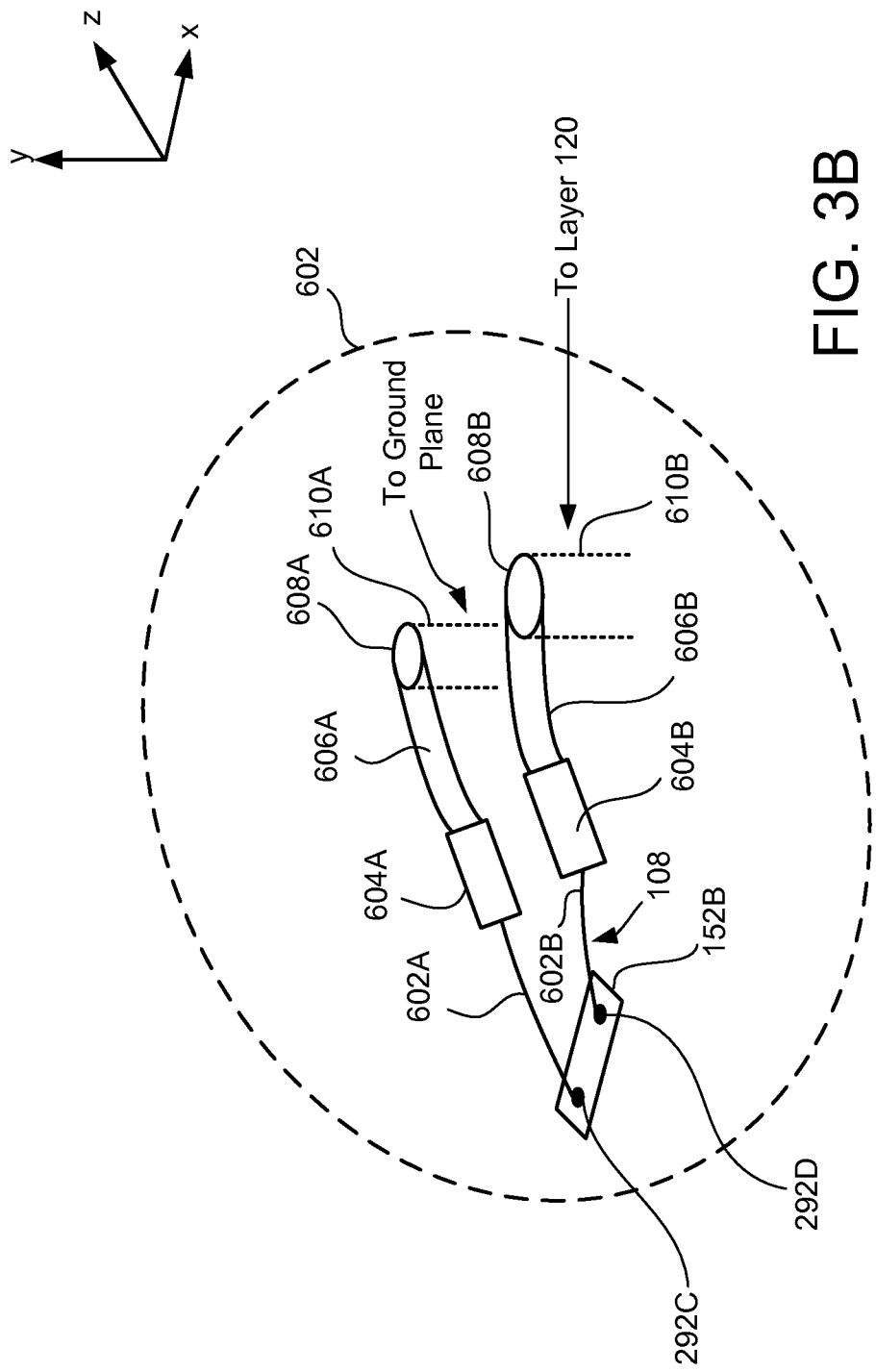
FIG. 3B is an isometric view of a portion of the circuit subsystem of FIG. 3A, in accordance with one embodiment of the present invention.

FIG. 3B is an isometric view of an embodiment of a portion 602 of the circuit subsystem 187 of FIG. 3A. A wire 602A is coupled with a point 292C on a pad 152B. The pad 152B is attached to memory controller chip 112 (FIG. 2A). The wire 602A is further coupled with a pad 604A, which is attached to layer 110 (FIG. 2A). The pad 604A is coupled with a communication medium 606A, which is coupled via a connection point 608A with a via 610A. The via 610A extends through layer 110 (FIG. 2A) to couple with the ground communication medium 142C (FIG. 4C).

Moreover, a wire 602B is coupled with a point 292D on pad 152B. The wire 602B is further coupled with a pad 604B, which is attached to layer 110 (FIG. 3A). The pad 604B is coupled with a communication medium 606B, which is coupled through a connection point 608B with a via 610B. The via 610B extends through layers 110 and 106 to layer 120 to couple with a communication medium that receives ground signal 108 from power supply 284 (FIG. 2).

In an embodiment in which memory controller chip 112 is located on layer 120, the chip receives ground signal 108 from the power supply 284 via a communication medium that is embedded within layer 120. The via 601A is coupled with the communication medium embedded within layer 120.

Differential signaling is provided by probing RF signal 116A and ground signal 108. The ground signal 108 is communicated from the ground pad 296 (FIG. 1) through the via 610B, connection point 608B, communication medium 606B, pad 604B, wire 602B, pad 152B, wire 602A, pad 604A, communication medium 606A, connection point 608A, via 610A, ground communication medium 142C, edge 299D of RF connector 172D, edge 295D of mating RF connector 186D, and cable 184D to channel connector 192B (FIG. 1). Moreover, referring to FIG. 3A, the RF signal 116A is communicated from the layer 120 through the via 144A, the connection point 146, the communication medium 290A, the pad 283A, the wire 154A, the pad 152A, the wire 154B, the pad 283B, the communication medium 290B, the resistor 138A, the communication medium 136A, the RF connector 172D, the mating RF connector 186D, and cable 184D to channel connector 192B (FIG. 1).

A via 158 extends through layers 102, 120, 106, and 110 to couple with a connection point 156, which is on top of layer 110. The connection point 102 is coupled via a communication medium 404 with a resistor 138B, which is located on top of layer 110. The resistor 138B is coupled via a communication medium 136B with the RF connector 172F. The mating RF connector 186F, which is shown in FIG. 4D, is coupled with the RF connector 172F. The mating RF connector 186F is coupled via a cable 184F with the channel connector 192D (FIG. 1).

Another via 166 extends through layers 102, 120, 106, and 110 to couple with a connection point 422, which is on top of layer 110. The connection point 422 is coupled via a communication medium 420 with a connection point 162, which is located on top of layer 110. The connection point 162 is coupled through a via 160 to the ground communication medium 142F. The RF connector 172F, which is shown in FIG. 4D, is coupled via an edge 299F (FIG. 5) of the RF connector 172F with the ground communication medium 142E and the mating RF connector 186F is coupled via an edge 295F with the edge 299F. The mating RF connector 186F is coupled via a cable 184F with the channel connector 192D (FIG. 1).

Moreover, a via 408 extends through layers 102, 120, 106, and 110 to couple with a connection point 410. The connection point 410 is coupled with a communication medium 412, which is coupled via the resistor 138C to another communication medium 136C. The communication medium 136C is coupled to an RF connector 172E, which is coupled with a mating RF connector 186E, which is shown in FIG. 5. The mating RF connector 186E is coupled via a cable 184E to the channel connector 192A, which is shown in FIG. 1. Also, an edge 299E of the RF connector 172E is coupled via layer 110 to ground plane 142F and an edge 295E of the mating RF connector 186E is coupled with edge 299E.

In one embodiment, a number of connection points 156, 410, and 422 are equal in number to the number of communication mediums 382, 384, and 386. In some embodiments, additional communication mediums, such as communication mediums 382, 384, and 386, are overlaid underneath the layer 102 and a number of connection points, such as connection points 156, 410, and 422, are matched to the communication mediums underneath layer 102.

Differential signaling is provided by receiving and probing RF signal 116C and the ground signal 108. The ground signal 108 is communicated from via 166 through connection point 422, communication medium 420, connection point 162, via 160, ground communication medium 142F, edge 299E of RF connector 172E, edge 295E of mating RF connector 186E, and cable 184E to channel connector 192 A (FIG. 1). Similarly, the RF signal 116C is communicated from the via 408 (FIG. 3A) through the connection point 410, communication medium 412, resistor 138C, communication medium 136C, RF connector 172E, RF mating connector 186E, cable 184E to channel connector 192A (FIG. 1).

Moreover, the RF signal 116B is communicated from the via 158 through connection point 156, communication medium 404, resistor 138B, communication medium 136B, RF connector 172F, mating RF connector 186F, and cable 184F to channel connector 192D (FIG. 1).

In various embodiments, the RF signal 116C is different than the RF signal 116B. For example, if the RF signal 116B is a power signal, the RF signal 116C is a control signal or a data signal.

In some embodiments, a dielectric layer is placed between any two adjacent layers. For example, a dielectric is placed between layers 102 and 120, another dielectric layer is placed between layers 120 and 106, and yet another dielectric layer is placed between layers 106 and 110.

It should be noted that in one embodiment, each resistor 138A, 138B, 138C, and 138D has a resistance to reduce a voltage of an RF signal communicated via the resistor to the oscilloscope 190. For example, any of resistors 138 has a resistance ranging from 3 kilo ohms to 7 kilo ohms. As another example, any of resistors 138 have a resistance of kilo ohms. In order to avoid overloading a sensing point, such as point 292B (FIG. 3A), connection point 156 and connection point 410, multiple resistors 138 are attached at an end of each communication medium 136A, 136B, and 136C. The use of resistors 138 facilitates high impedance connections while attenuating measurement signals, such as RF signals 116.

Moreover, it should be noted that each communication medium 290A (FIG. 3A), 606A, 606B, and 420 (FIG. 3A) acts as a trace with parasitic inductance, which may attenuate high frequency part of corresponding signals 116A, 108, and 116C and are usually short in length. For example, the communication mediums 290A, 606A, and 606B are shorter in length than communication medium 136A. Moreover, the communication medium 420 is shorter in length than a combination of communication mediums 136B and 404 (FIG. 2A) and than a combination of communication mediums 136C and 412 (FIG. 2A).

It should further be noted that in other embodiments, any other chip can be probed in a similar manner to that of probing the memory controller chip 112. For example, the memory chip 132 is probed in a similar manner to that of the memory controller chip 112.

Moreover, although in the above-described embodiments, the layers 102, 120, 106, and 110 are described as being arranged in an order, in some embodiments, the layers 102, 120, 106, and 110 are arranged in a different order than that shown in FIG. 3A. For example, the layer 110 is located below layer 106. Moreover, the layer 106 is located on top of layer 120, which is located on top of layer 102. In these embodiments, the vias 158, 408, and 166 extend through layers 110, 120, and 102. Moreover, via 144A extends through the layer 110 to couple with layer 120. Also, the vias 610A and 160 extend through layer 106 to couple with corresponding ground communication mediums 142 in a manner described above. The via 610B extends though layer 110 to couple to a communication medium of layer 120.

In another embodiment, the circuit subsystem 187 excludes the layers 102 and 120. In this embodiment, the memory controller chip 112 is coupled thru via 144A and one or more communication mediums with circuit components of the layer 106. In this embodiment, the layer 106 communicates ground signal 108 and other RF signals, such as RF signal 116A, which are communicated via the one or more communication mediums.

In yet another embodiment, in addition to the exclusion of the layers 102 and 120 and the inclusion of the coupling between the memory controller chip 112 and the circuit components of layer 106, the communication mediums 382, 384, and 386 are overlaid underneath layer 106 and the vias 158, 408, and 166 extend to layer 106. Moreover, in this embodiment, the communication mediums 382, 384, and 396 are used to communicate signals in a similar manner as that described above.

In another embodiment, the circuit subsystem 187 excludes the layers 102 and 120. Moreover, the memory controller chip 112 and/or the memory chip 132 are not coupled with layer 110. Also, the communication mediums 382, 384, and 386 are overlaid underneath layer 106 and the vias 158, 408, and 166 extend to layer 106.

In the embodiments in which the circuit subsystem 187 excludes the layers 102 and 120, the extension 112 includes portions of the layers 110 and 106 and the portion 124 includes the remaining portions of the layers 110 and 106.

In still another embodiment, the circuit subsystem 187 excludes the layer 102 and the vias 158, 408, and 166.

In another embodiment, the circuit subsystem 187 excludes the layer 102 and the communication mediums 382, 384, and 386 are overlaid underneath layer 120. Moreover, in this embodiment, the vias 158, 408, and 166 extend to layer 120.

In the embodiments in which the circuit subsystem 187 excludes the layer 102, the extension 122 includes a portion of the layer 120, 106, and 110 and the portion 124 includes the remaining portions of the layers 120, 106, and 110.

FIG. 4A is a bottom view of an embodiment of layer 102. The communication mediums 382, 384, and 386 are visible in the bottom view.

FIG. 4B is a top view of an embodiment of layer 120.

FIG. 4C is a top view of an embodiment of layer 106. The ground communication mediums 142 are overlaid on top of layer 106 to communicate the ground signal 108.

FIG. 4D is a top view of an embodiment of layer 110. As shown, the layer 110 accommodates the RF connectors 172 that receive the RF mating connectors 186.

FIG. 5 is an isometric view of an embodiment of RF connectors 172, RF mating connectors 186, and cables 184. Each RF connector includes an edge that is coupled with the ground signal 108. For example, the RF connector 172A includes the edge 299A, the RF connector 172B includes an edge 299B, the RF connector 172C includes an edge 299C, the RF connector 172D includes the edge 299D, the RF connector 172E includes an edge 299E, the RF connector 172F includes the edge 299F, the RF connector 172G includes an edge 299G, and the RF connector 172H includes an edge 299H Each RF mating connector includes an edge that is coupled with an edge of the corresponding RF connector. For example, the RF mating connector 186A includes the edge 295A that is coupled with the edge 299A, the RF mating connector 186B includes an edge 295B that is coupled with the edge 299B, the RF mating connector 186C includes an edge 295C that is coupled with the edge 299C, the RF mating connector 186D includes the edge 295D that is coupled with the edge 299D, the RF mating connector 186E includes an edge 295E that is coupled with the edge 299E, the RF mating connector 186F includes the edge 295F that is coupled with the edge 299F, the RF mating connector 186G includes an edge 295G that is coupled with the edge 299G, and the RF mating connector 186H includes an edge 295H that is coupled with the edge 299H.

It should be noted that the above-described embodiments can be applied to any subscriber identity module (SIM) card that has an I/O interface for measurement of signals.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A circuit system comprising:
a plurality of layers including an insertion portion and an extension portion;
a first layer of the plurality of layers, wherein the first layer is coupled with a first integrated circuit chip located in the insertion portion on top of the first layer, wherein the first integrated circuit chip is coupled to a second integrated circuit chip located on top of the first integrated circuit chip, the first layer having a plurality of traces in the extension portion of the first layer, wherein the traces are configured to transfer radio frequency (RF) signals;
a second layer of the plurality of layers, wherein the second layer has a ground communication medium in the extension portion of the second layer, wherein the second layer is disposed below the first layer;
a third layer disposed below the second layer; and
a fourth layer disposed below the third layer, the fourth layer having a top side facing the third layer and a bottom side that is opposite the top side, the bottom side having a plurality of connector fingers in the insertion portion of the fourth layer for facilitating communication of a signal that is communicated between the second integrated circuit chip and a host controller located within a host device,
a plurality of RF connectors disposed on the extension portion of the first layer, wherein the RF connectors are coupled to the traces, each of the RF connectors for coupling to an oscilloscope via a cable,
wherein the insertion portion is configured to be inserted into the host device and the extension portion is configured to extend from the host device to facilitate a transfer to the oscilloscope of one of the RF signals that is received via one of the traces and that is representative of the signal that is communicated between the second integrated circuit chip and the host controller located within the host device.

2. The circuit system of claim 1, wherein one of the traces is coupled via a resistor and a plurality of pads to an input/output (I/O) interface of the second integrated circuit chip for attenuating power of the one of the RF signals, wherein the signal that is communicated between the second integrated circuit chip and the host controller is a digital form of the one of the RF signals.

3. A circuit system comprising:
a plurality of layers defining an extension portion and an insertion portion;
a first layer of the plurality of layers, wherein the first layer has traces in the extension portion of the first layer for routing one or more radio frequency (RF) signals;

a second layer of the plurality of layers, wherein the second layer has a ground plane for facilitating routing of the RF signals, the ground plane being disposed in the extension portion;

a memory chip disposed over the first layer in the insertion portion and on top of the traces;

a controller chip integrated with the memory chip in the insertion portion;

a plurality of connector fingers disposed on an end of the insertion portion, the plurality of connector fingers configured to be inserted into a host device for facilitating communication of a signal that is communicated between the controller chip and an integrated circuit inside the host device; and a plurality of RF connectors disposed on ends of the traces in the extension portion of the first layer for coupling to an oscilloscope;

wherein the insertion portion is configured to be inserted into the host device and the extension portion is configured to extend from the host device to facilitate a transfer to the oscilloscope of one of the RF signals that is received via one of the traces and that is representative of the signal that is communicated between the controller chip and an integrated circuit inside the host device.

4. The circuit system of claim 3, wherein each trace is connected to a resistor to attenuate power of the one of the RF signals.

5. The circuit system of claim 3, wherein the extension portion is fabricated as a plurality of printed circuit boards, or a plurality of substrates, or a plurality of flexible cables, wherein the signal that is communicated between the controller chip and the integrated circuit inside the host device is a digital form of the one of the RF signals.

6. The circuit system of claim 3, wherein one of the traces is coupled via a resistor and a plurality of pads to an input/output (I/O) interface of the controller chip for attenuating power of one of the RF signals.

7. The circuit system of claim 3, wherein the ground plane is coupled through a via between the first and second layers to an outer contact of one of the RF connectors for providing a ground reference voltage to the one of the RF signals.

8. The circuit system of claim 3, wherein the one of the traces is connected to an inner contact of one of the RF connectors for providing the one of the RF signals to the oscilloscope via a cable.

9. The circuit system of claim 3, wherein another one of the traces is within the extension portion and the insertion portion of the first layer, wherein the other one of the traces is connected to one of the connector fingers through a via for transferring to the oscilloscope one of the RF signals is representative of a digital signal received from the integrated circuit, wherein the via extends through the first and second layers.

10. The circuit system of claim 3, further comprising a third layer of the plurality of layers, the third layer located below the second layer, the third layer including a communication medium that is connected through a via with one of the traces of the first layer.

11. The circuit system of claim 10, further comprising a fourth layer of the plurality of layers, wherein the plurality of connector fingers is disposed in the insertion portion of the fourth layer, wherein the fourth layer is disposed below the third layer.

12. The circuit system of claim 3, wherein the extension portion is wider than the insertion portion for facilitating insertion of the insertion portions into a slot of the host device and extension from the slot of the extension portions outside the host device.

13. The circuit system of claim 3, wherein the one of the traces of the first layer, a substrate portion of the first layer, and the ground plane of the second layer forms a microstrip line, wherein the substrate portion is located between the one of the traces and the ground plane.

14. A circuit system comprising:

a plurality of layers defining an extension portion and an insertion portion;

a first layer of the plurality of layers having a ground plane in the extension portion;

a second layer of the plurality of layers disposed over the first layer and having traces in the extension portion for routing one or more radio frequency (RF) signals;

a plurality of connector fingers disposed on an end of the insertion portion, the plurality of connector fingers configured to be inserted into a host device for facilitating communication of a signal with an integrated circuit inside the host device; and a plurality of RF connectors disposed on ends of the traces in the extension portion of the first layer for coupling to an oscilloscope;

wherein the insertion portion is configured to be inserted into the host device and the extension portion is configured to extend from the host device to facilitate a transfer to the oscilloscope of one of the RF signals that is received via one of the traces and that is representative of the signal communicated with the integrated circuit inside the host device.

15. The circuit system of claim 14, wherein each trace is connected to a resistor to attenuate power of the one of the RF signals.

16. The circuit system of claim 14, wherein the extension portions are fabricated as a plurality of printed circuit boards, or a plurality of substrates, or a plurality of flexible cables.

17. The circuit system of claim 14, further comprising a controller chip located over the second layer, wherein one of the traces is coupled via a resistor and a plurality of pads to an input/output (I/O) interface of the controller chip for attenuating power of one of the RF signals.

18. The circuit system of claim 14, wherein the ground plane is coupled through a via between the first and second layers to an outer contact of one of the RF connectors for providing a ground reference voltage to the one of the RF signals.

19. The circuit system of claim 14, wherein the one of the traces is connected to an inner contact of one of the RF connectors for providing the one of the RF signals to the oscilloscope via a cable.

20. The circuit system of claim 14, wherein the signal communicated with the integrated circuit inside the host device is a digital form of the one of the RF signals.

* * * * *